US009035320B2

(12) United States Patent
Saito et al.

(10) Patent No.: US 9,035,320 B2
(45) Date of Patent: May 19, 2015

(54) SEMICONDUCTOR DEVICE

(71) Applicant: KABUSHIKI KAISHA TOSHIBA, Minato-ku (JP)

(72) Inventors: Yasunobu Saito, Tokyo (JP); Hidetoshi Fujimoto, Kanagawa-ken (JP); Tetsuya Ohno, Kanagawa-ken (JP); Akira Yoshioka, Kanagawa-ken (JP); Wataru Saito, Kanagawa-ken (JP); Toshiyuki Naka, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/971,264

(22) Filed: Aug. 20, 2013

(65) Prior Publication Data
US 2014/0077217 A1   Mar. 20, 2014

(30) Foreign Application Priority Data
Sep. 19, 2012   (JP) ................. 2012-206041

(51) Int. Cl.
*H01L 29/45* (2006.01)
*H01L 23/482* (2006.01)
(Continued)

(52) U.S. Cl.
CPC ......... *H01L 29/2003* (2013.01); *H01L 29/7786* (2013.01); *H01L 29/4175* (2013.01); *H01L 29/0657* (2013.01); *H01L 2224/16225* (2013.01)

(58) Field of Classification Search
CPC ........... H01L 2224/16225; H01L 29/2003; H01L 29/0657; H01L 29/4175; H01L 29/7786

USPC ............................. 257/76, 192, 745
See application file for complete search history.

(56) References Cited

U.S. PATENT DOCUMENTS 7,038,252 B2 *  5/2006  Saito et al. .................... 257/192
7,476,918 B2 *  1/2009  Nishijima et al. ............ 257/276
(Continued)

FOREIGN PATENT DOCUMENTS

JP   2005-244072 A   9/2005
JP   2006-196869 A   7/2006
(Continued)

OTHER PUBLICATIONS

Japanese Office Action issued on Nov. 7, 2014 in corresponding Japanese Application No. 2012-206041, along with English translation thereof.

*Primary Examiner* — Earl Taylor
(74) *Attorney, Agent, or Firm* — White & Case LLP

(57) ABSTRACT

According to one embodiment, a semiconductor device includes a substrate, a first semiconductor region, a second semiconductor region, a first electrode, a first electrode and a conducting section. The substrate includes a conductive region and has a first surface. The first semiconductor region is provided on the first surface side of the substrate and includes $Al_XGa_{1-X}N$ ($0 \leq X \leq 1$). The second semiconductor region is provided on a side opposite to the substrate of the first semiconductor region and includes $Al_YGa_{1-Y}N$ ($0 \leq Y \leq 1$, $X \leq Y$). The first electrode is provided on a side opposite to the first semiconductor region of the second semiconductor region and ohmically connects to the second semiconductor region. The conducting section electrically connects between the first electrode and the conductive region.

12 Claims, 13 Drawing Sheets

(51) Int. Cl.
*H01L 29/20* (2006.01)
*H01L 29/778* (2006.01)
*H01L 29/417* (2006.01)
*H01L 29/06* (2006.01)

(56) References Cited

U.S. PATENT DOCUMENTS

| | | | |
|---|---|---|---|
| 2005/0189559 A1* | 9/2005 | Saito et al. | 257/189 |
| 2007/0176215 A1* | 8/2007 | Yanagihara et al. | 257/288 |
| 2007/0278521 A1* | 12/2007 | Ishida et al. | 257/192 |
| 2008/0054300 A1* | 3/2008 | Nikkel et al. | 257/192 |
| 2008/0079023 A1* | 4/2008 | Hikita et al. | 257/192 |
| 2009/0121775 A1* | 5/2009 | Ueda et al. | 327/427 |
| 2011/0114967 A1* | 5/2011 | Hikita et al. | 257/76 |
| 2014/0077217 A1* | 3/2014 | Saito et al. | 257/76 |

FOREIGN PATENT DOCUMENTS

| | | | |
|---|---|---|---|
| JP | 2008-258419 A | | 10/2008 |
| JP | 2009-164301 A | | 7/2009 |
| JP | 2009-278028 | | 11/2009 |
| JP | 2009278028 A | * | 11/2009 |
| JP | 2010-016093 A | | 1/2010 |
| JP | 2010-109086 A | | 5/2010 |
| JP | 2010-135824 A | | 6/2010 |
| WO | 2010/117987 A1 | | 10/2010 |
| WO | 2012-082840 A1 | | 6/2012 |

* cited by examiner

SEMICONDUCTOR DEVICE

CROSS-REFERENCE TO RELATED APPLICATIONS

This application is based upon and claims the benefit of priority from Japanese Patent Application No. 2012-206041, filed on Sep. 19, 2012; the entire contents of which are incorporated herein by reference.

FIELD

Embodiments described herein relate generally to a semiconductor device.

BACKGROUND

Semiconductor devices based on nitride semiconductor can improve the tradeoff between breakdown voltage and on-resistance. Thus, lower on-resistance and higher breakdown voltage can be achieved beyond devices based on silicon (Si). In general, in semiconductor devices based on gallium nitride (GaN), a phenomenon called current collapse may occur and result in increasing the on-resistance. Current collapse is a phenomenon of current decrease under application of high electric field. To avoid this phenomenon requires dispersing the electric field inside the device. For instance, the electric field inside the device is dispersed by ingeniously designing the surface structure of the semiconductor device.

In such a semiconductor device based on nitride semiconductor, further stabilization in characteristics is desired.

DETAILED DESCRIPTION

Figure 1:
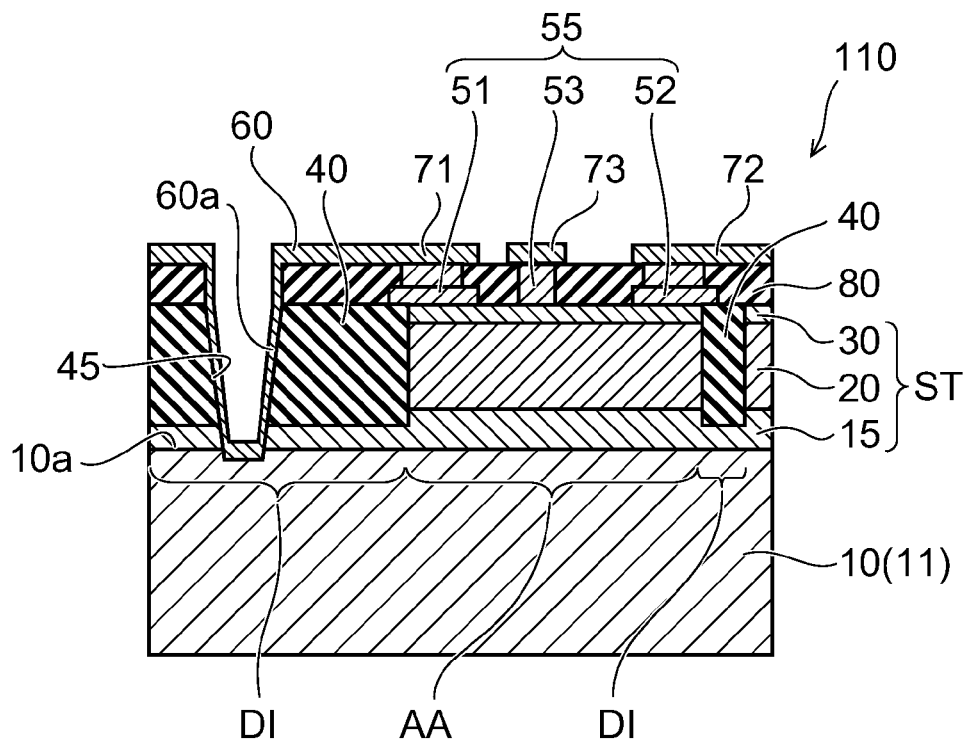
FIG. 1 is a schematic sectional view illustrating the configuration of a semiconductor device according to a first embodiment.

In general, according to one embodiment, a semiconductor device includes a substrate, a first semiconductor region, a second semiconductor region, a first electrode, a first electrode and a conducting section. The substrate includes a conductive region and has a first surface. The first semiconductor region is provided on the first surface side of the substrate and includes $Al_XGa_{1-X}N$ ($0 \leq X \leq 1$). The second semiconductor region is provided on a side opposite to the substrate of the first semiconductor region and includes $Al_YGa_{1-Y}N$ ($0 \leq Y \leq 1$, $X \leq Y$). The first electrode is provided on a side opposite to the first semiconductor region of the second semiconductor region and ohmically connects to the second semiconductor region. The conducting section electrically connects between the first electrode and the conductive region.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. In the present specification and the drawings, components similar to those described previously with reference to earlier figures are labeled with like reference numerals, and the detailed description thereof is omitted appropriately. In the following description, the notations of $n^+$, n, $n^-$ and $p^+$, p, $p^-$ represent relative magnitude of impurity concentration in each conductivity type.

(First Embodiment)

FIG. 1 is a schematic sectional view illustrating the configuration of a semiconductor device according to a first embodiment.

As shown in FIG. 1, the semiconductor device 110 according to the first embodiment includes a support substrate 10, a first semiconductor region 20, a second semiconductor region 30, a first electrode 51, a control electrode 53, and a conducting section 60. The semiconductor device 110 further includes a second electrode 52. The semiconductor device 110 is e.g. a GaN-based field effect transistor.

The support substrate 10 includes a conductive region 11. The conductive region 11 may be provided either partly or entirely in the support substrate 10. The support substrate 10 is e.g. a semiconductor substrate having relatively high impurity concentration (e.g., $n^+$-type silicon substrate, $p^+$-type silicon substrate, or n-type silicon carbide substrate), or an SOI (silicon on insulator) substrate. This embodiment is described with reference to an example of using an $n^+$-type silicon substrate in which the conductive region 11 is provided entirely in the support substrate 10. The support substrate 10 has a first surface 10a.

The first semiconductor region 20 is provided on the support substrate 10. The first semiconductor region 20 is provided on the first surface 10a side of the support substrate 10. The first semiconductor region 20 includes a nitride semiconductor. For instance, the first semiconductor region 20 includes $Al_XGa_{1-X}N$ ($0 \leq X \leq 1$). In this embodiment, the first semiconductor region 20 is made of GaN. In this embodiment, the term "on" or "above" (upper side) is used so that the direction from the support substrate 10 toward the first semiconductor region 20 represents the upward direction.

Between the support substrate 10 and the first semiconductor region 20, a buffer layer 15 may be provided. In this embodiment, the first semiconductor region 20 is formed by e.g. epitaxial growth on the buffer layer 15. Thus, the buffer layer 15 is made of a material (e.g., AlN or AlGaN) suitable for epitaxial growth of a GaN-based material.

The second semiconductor region 30 is provided on the first semiconductor region 20. The second semiconductor region 30 is provided on the side opposite to the support substrate 10 of the first semiconductor region 20. The second semiconductor region 30 includes a nitride semiconductor. For instance, the second semiconductor region 30 includes Al$_Y$Ga$_{1-Y}$N (0≤Y≤1, X≤Y). The second semiconductor region 30 is formed by e.g. epitaxial growth on the first semiconductor region 20. In this embodiment, the second semiconductor region 30 is made of AlGaN.

The bandgap of the second semiconductor region 30 is equal to or larger than the bandgap of the first semiconductor region 20. Furthermore, this second semiconductor region 30 may be either undoped or doped in n-type. The stacked structural body ST including the buffer layer 15, the first semiconductor region 20, and the second semiconductor region 30 is formed in this order by epitaxial growth on the support substrate 10. The first semiconductor region 20 and the second semiconductor region 30 of the stacked structural body ST constitute a heterojunction structure.

The stacked structural body ST undergoes device isolation. For instance, the stacked structural body ST is etched in a mesa shape from the second semiconductor region 30 halfway through the buffer layer 15. The mesa-shaped portion of the stacked structural body ST constitutes a device region AA, and the portion around the mesa-shaped portion constitutes a device isolation region DI. In the device isolation region DI, an insulating section 40 is formed.

The first electrode 51 is provided on the second semiconductor region 30. The first electrode 51 is provided on the side opposite to the first semiconductor region 20 of the second semiconductor region 30. The first electrode 51 is ohmically connected to the second semiconductor region 30. The first electrode 51 is e.g. a source electrode of the field effect transistor.

The second electrode 52 is provided on the second semiconductor region 30. The second electrode 52 is provided on the side opposite to the first semiconductor region 20 of the second semiconductor region 30. The second electrode 52 is ohmically connected to the second semiconductor region 30. The second electrode 52 is spaced from the first electrode 51. The second electrode 52 is e.g. a drain electrode of the field effect transistor.

The control electrode 53 is provided on the second semiconductor region 30. The control electrode 53 is provided on the side opposite to the first semiconductor region 20 of the second semiconductor region 30. The control electrode 53 is provided between the first electrode 51 and the second electrode 52. The control electrode 53 is e.g. Schottky connected to the second semiconductor region 30. The control electrode 53 is a gate electrode of the field effect transistor. For instance, the spacing between the control electrode 53 and the second electrode 52 is wider than the spacing between the control electrode 53 and the first electrode 51. This relaxes electric field concentration on the region between the gate electrode and the drain electrode.

Besides the structure based on Schottky connection to the second semiconductor region 30, the gate electrode structure of the control electrode 53 may be a MOS (metal oxide semiconductor) structure, MIS (metal insulator semiconductor) structure, or junction gate structure.

An interlayer insulating film 80 is formed on the electrode layer 55 in which the first electrode 51, the second electrode 52, and the control electrode 53 are formed. On the interlayer insulating film 80, wiring sections 71, 72, and 73 are provided. In the example shown in FIG. 1, for instance, the wiring section 71 is in electrical continuity with the first electrode 51. The wiring section 72 is in electrical continuity with the second electrode 52. The wiring section 73 is in electrical continuity with the control electrode 53.

The conducting section 60 electrically connects between the first electrode 51 and the conductive region 11 of the support substrate 10. In the embodiment, the term of "electrically connect" includes the cases in which the two elements are directly connected and in which the passive circuit such as a capacitor and a coil intervenes between the two elements. The conducting section 60 is provided through e.g. the interlayer insulating film 80 and the insulating section 40 provided in the device isolation region DI. The conducting section 60 has a portion 60a extending from the second semiconductor region 30 toward the first semiconductor region 20. The portion 60a is provided along a side surface of the insulating section 40. In the interlayer insulating film 80 and the insulating section 40, a through-hole 45 extending from the surface of the interlayer insulating film 80 to the support substrate 10 (conductive region 11) is provided. The conducting section 60 is formed along e.g. the inner wall of the through-hole 45. Alternatively, the conducting section 60 may be embedded in the through-hole 45. Furthermore, the conducting section 60 is connected to the wiring section 71. Thus, the first electrode 51 is electrically connected to the conductive region 11 of the support substrate 10 via the wiring section 71 and the conducting section 60.

Thus, in the semiconductor device 110 according to this embodiment, the first electrode 51 is electrically connected to the conductive region 11 of the support substrate 10 by the conducting section 60. Accordingly, the potential of the support substrate 10 is fixed to the potential of the first electrode 51 (source electrode). Thus, in the semiconductor device 110, the conductive region 11 of the support substrate 10 develops a current collapse suppression effect. Accordingly, a GaN-based field effect transistor having small characteristics variation is configured.

Here, if the conducting section 60 as described above is not provided, the conductive region 11 of the support substrate 10 is not connected to any electrode. Thus, the potential of the conductive region 11 is not fixed. In contrast, by providing the conducting section 60 as in this embodiment, the potential of the conductive region 11 of the support substrate 10 is fixed to the potential of the first electrode 51. Then, the conductive region 11 provided entirely on the lower side of the device region AA develops an electric field relaxation effect. Thus, the conductive region 11 functions as a field plate electrode and suppresses current collapse. This stabilizes the characteristics of the semiconductor device 110.

The formation of the conducting section 60 results in increasing the area of the wiring section 71 where the through-hole 45 is formed. However, the conducting section 60 is intended to provide a potential to the conductive region 11. Thus, there is no need to form the conducting section 60 throughout the wiring section 71 to decrease the resistance. That is, it is sufficient to form the conducting section 60 only in part of the wiring section 71. Furthermore, the connection between the conducting section 60 and the conductive region 11 preferably exhibits ohmic characteristics. However, as described above, the conducting section 60 is intended to provide a specific potential (e.g., ground potential) to the conductive region 11. Thus, ohmic characteristics with low resistance are not essential to this connection.

(Second Embodiment)

Figure 2:
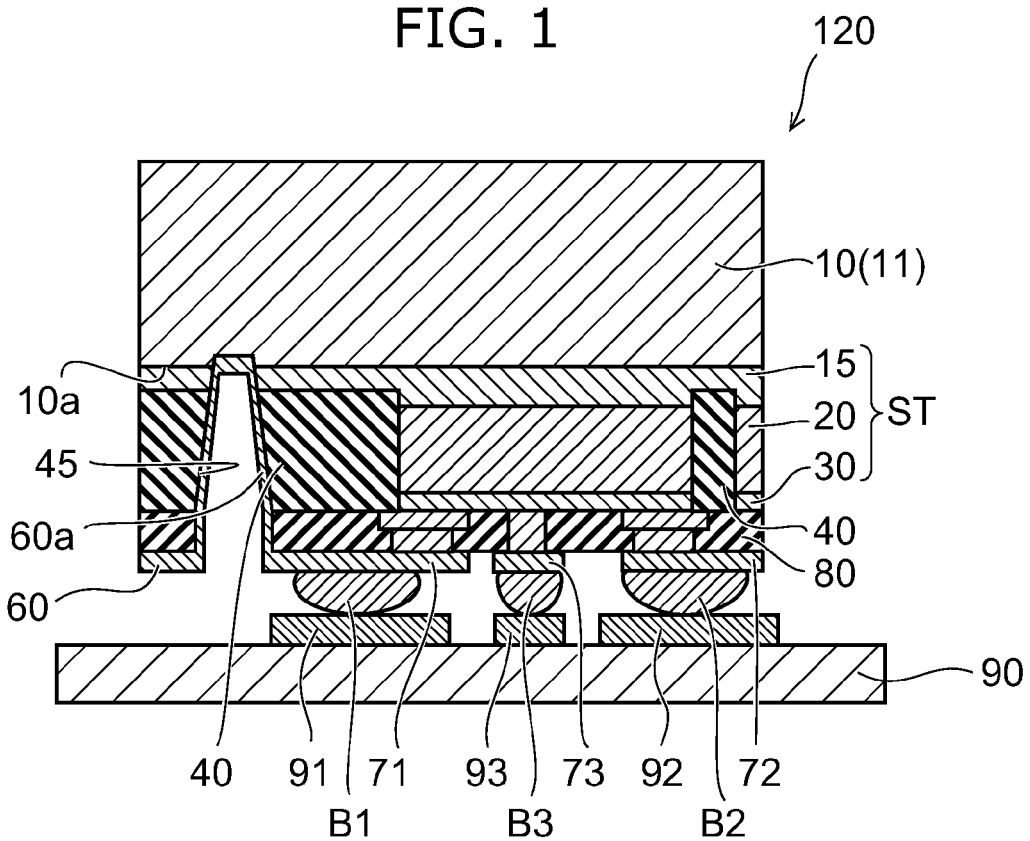
FIG. 2 is a schematic sectional view illustrating the configuration of a semiconductor device according to a second embodiment.

FIG. 2 is a schematic sectional view illustrating the configuration of a semiconductor device according to a second embodiment.

As shown in FIG. 2, in addition to the configuration of the semiconductor device 110 according to the first embodiment, the semiconductor device 120 according to the second embodiment includes bump electrodes B1, B2, and B3 provided on the wiring sections 71, 72, and 73, respectively. In FIG. 2, the configuration of the semiconductor device 110 shown in FIG. 1 is shown upside down.

The bump electrode B1 is provided on the wiring section 71 in electrical continuity with the first electrode 51. The bump electrode B2 is provided on the wiring section 72 in electrical continuity with the second electrode 52. The bump electrode B3 is provided on the wiring section 73 in electrical continuity with the control electrode 53.

The bump electrodes B1, B2, and B3 are connected to wiring patterns 91, 92, and 93 provided on a substrate 90. That is, the wiring sections 71, 72, and 73 are connected to the wiring patterns 91, 92, and 93 via the bump electrodes B1, B2, and B3. In addition to the bump electrodes B1, B2, and B3, the semiconductor device 120 may include the substrate 90 on which the wiring patterns 91, 92, and 93 are formed. Thus, the semiconductor device 120 realizes a flip-chip mounting structure in which the semiconductor device 110 according to the first embodiment is mounted on the substrate 90 via the bump electrodes B1, B2, and B3.

Figure 3:
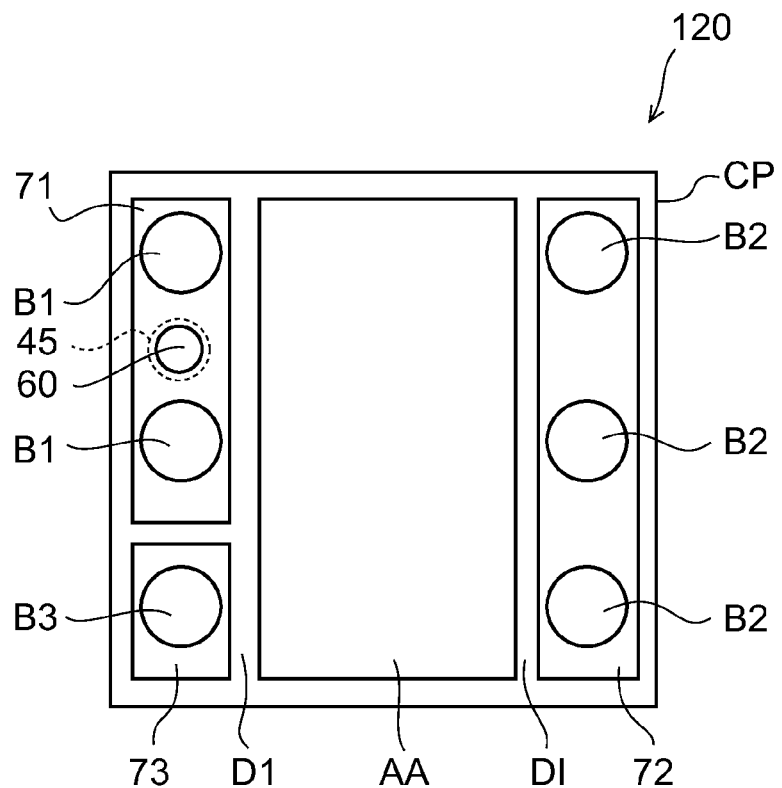
FIG. 3 is a schematic plan view illustrating the layout of the bump electrodes.

FIG. 3 is a schematic plan view illustrating the layout of the bump electrodes.

FIG. 3 shows a schematic plan view of the surface of a chip cut out of a semiconductor wafer with the bump electrodes formed on the surface. In the device region AA, for instance, the semiconductor device 120 shown in FIG. 2 is provided. A plurality of semiconductor devices 120 may be provided in the device region AA of one chip CP. The wiring sections 71, 72, and 73 are provided around the device region AA. The wiring sections 71, 72, and 73 extend out from the device region AA and are partly exposed from the surface of the chip. The exposed portions of the wiring sections 71, 72, and 73 are provided in a size necessary for forming the bump electrodes B1, B2, and B3, respectively.

The bump electrodes B1, B2, and B3 are formed on part of the wiring sections 71, 72, and 73, respectively. The bump electrodes B1, B2, and B3 serve for electrical connection in flip-chip mounting of the chip on the substrate 90, and also function as support legs. Thus, the bump electrodes B1, B2, and B3 are placed on the periphery of the chip to support the chip in a well-balanced manner. For instance, bump electrodes are placed at four corners of the chip. Alternatively, in addition to four corners of the chip, bump electrodes are placed in the central portion of two sides of the chip parallel to each other.

The number of bump electrodes B1, B2, and B3 formed on part of the wiring sections 71, 72, and 73, respectively, is at least one. In the example shown in FIG. 3, two bump electrodes B1 are provided on part of the wiring section 71. Three bump electrodes B2 are provided on part of the wiring section 72. One bump electrode B3 is provided on part of the wiring section 73.

The through-hole 45 and the conducting section 60 are provided at positions of the wiring section 71 where the bump electrode B1 is not formed. Thus, the formation of the bump electrode B1 is not hindered by the through-hole 45.

In the flip-chip mounting structure as in the semiconductor device 120, the need of wiring by bonding wires is eliminated. This reduces parasitic inductance due to bonding wires and improves high frequency characteristics. Furthermore, in the flip-chip mounting structure, the mounting process is simplified. This leads to reduction of manufacturing cost.

In such a flip-chip mounting structure, the support substrate 10 (conductive region 11) is placed on the opposite side from the substrate 90 across the stacked structural body ST. That is, the wiring pattern 91 is not directly connected to the conductive region 11. Thus, if the conducting section 60 is not provided, the conductive region 11 of the support substrate 10 is not electrically connected to the wiring pattern 91 and placed at a floating potential.

In this embodiment, the conducting section 60 is provided. Thus, even in the flip-chip mounting structure, the potential of the conductive region 11 is fixed. Accordingly, lines of electric force can be terminated also on the support substrate 10 side to relax electric field concentration. This results in improving the current collapse suppression effect of the semiconductor device 120 and realizing a semiconductor device 120 of the flip-chip mounting structure having small characteristics variation and being stabilized.

Figure 4:
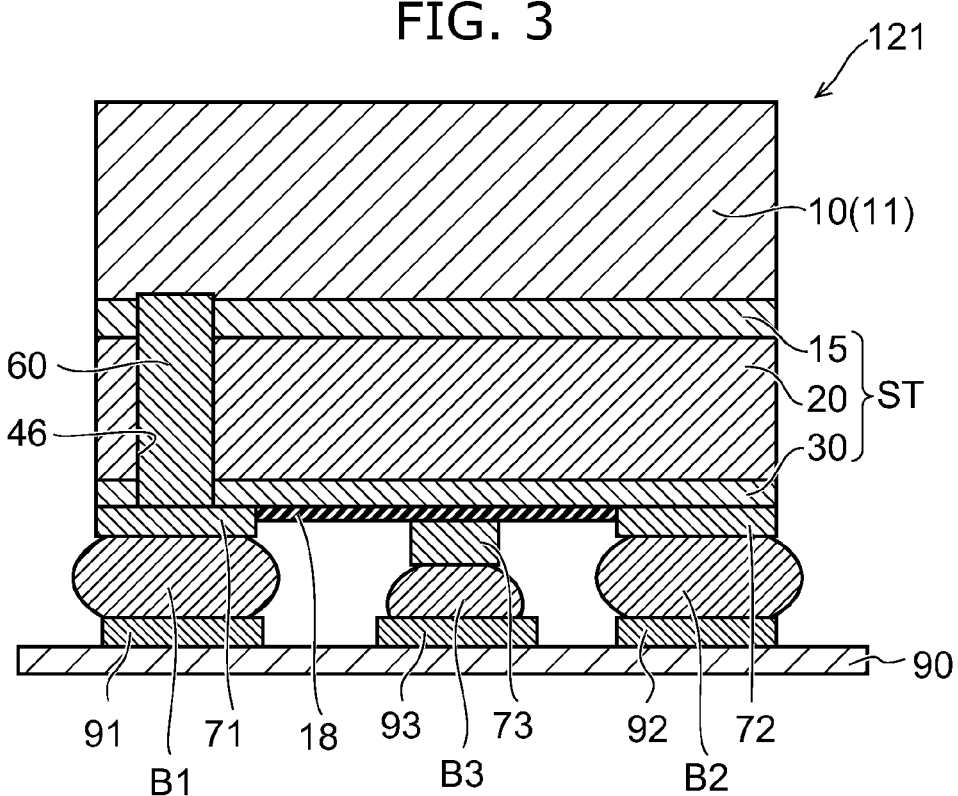
FIG. 4 and FIG. 5 are schematic sectional views illustrating alternative configurations of the semiconductor device according to the second embodiment.
Figure 5:
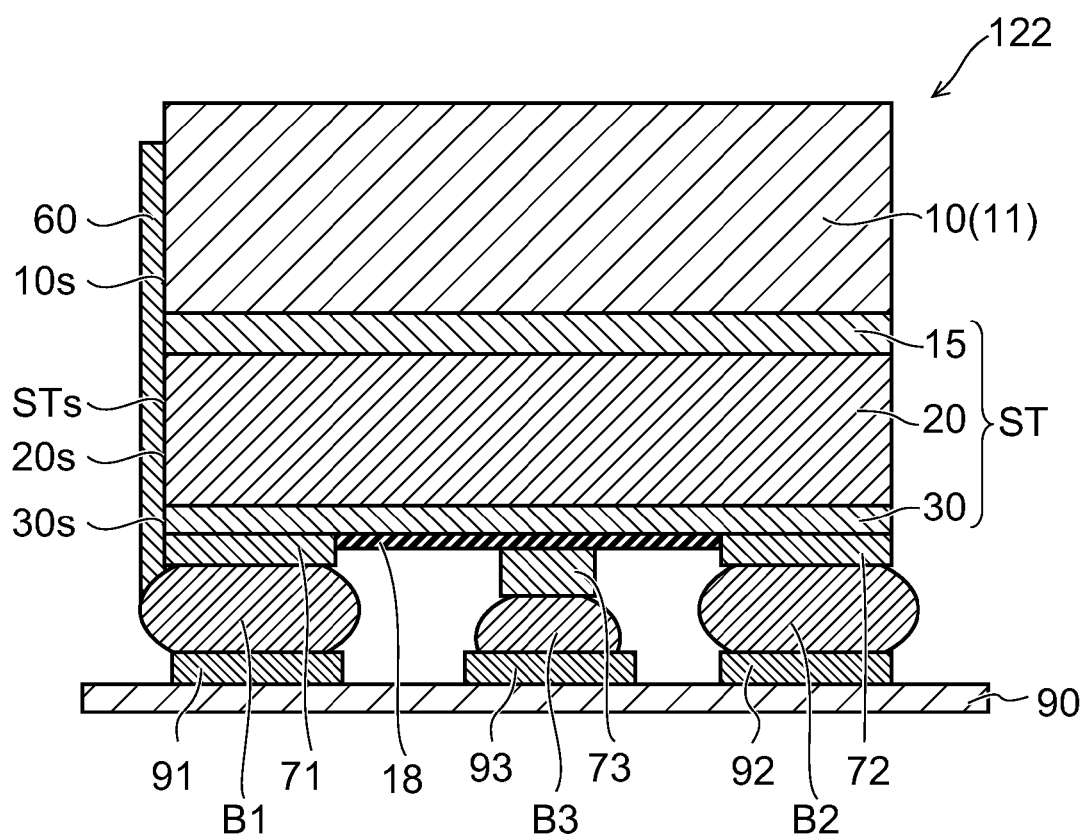

FIGS. 4 and 5 are schematic sectional views illustrating alternative configurations of the semiconductor device according to the second embodiment.

The semiconductor devices 121 and 122 shown in FIGS. 4 and 5 illustrate a gate electrode structure of the MIS structure in which an insulating film 18 is provided between the control electrode 53 (gate electrode) and the second semiconductor region 30.

As shown in FIG. 4, the semiconductor device 121 includes a conducting section 60 provided inside a hole (through-hole 46) penetrating through the second semiconductor region 30 and the first semiconductor region 20. In the example shown in FIG. 4, the through-hole 46 penetrates through the stacked structural body ST including the second semiconductor region 30, the first semiconductor region 20, and the buffer layer 15. The conducting section 60 is embedded inside the through-hole 46, and electrically connects between the wiring section 71 and the conductive region 11 of the support substrate 10. The conducting section 60 may be embedded entirely inside the through-hole 46, or may be embedded via an insulating film (not shown) provided on the inner wall of the through-hole 46.

In the semiconductor device 121, as in the semiconductor devices 110 and 120, the potential of the conductive region 11 is fixed. This realizes a semiconductor device 121 of the flip-chip mounting structure having small characteristics variation and being stabilized by suppression of current collapse. Furthermore, the conducting section 60 is provided so as to penetrate through the stacked structural body ST. Thus, compared with the case of providing the conducting section 60 in the device isolation region, the chip area is reduced.

As shown in FIG. 5, the semiconductor device 122 includes a conducting section 60 provided along the side surfaces 20s and 30s of the first semiconductor region 20 and the second semiconductor region 30, respectively. In the example shown in FIG. 5, the conducting section 60 is provided from the side surface 10s of the support substrate 10 including the conductive region 11 along the side surface STs of the stacked structural body ST to the wiring section 71. Thus, the conducting section 60 electrically connects between the wiring section 71 and the conductive region 11 of the support substrate 10.

In the semiconductor device 122, as in the semiconductor devices 110 and 120, the potential of the conductive region 11 is fixed. This realizes a semiconductor device 122 of the flip-chip mounting structure having small characteristics variation and being stabilized by suppression of current collapse. Furthermore, the conducting section 60 is provided along the side surface STs of the stacked structural body ST. Thus, compared with the case of providing the conducting section 60 in the device isolation region, the chip area is reduced. Furthermore, there is no need to form a through-hole in the stacked structural body ST in order to provide the conducting section 60. This simplifies the manufacturing process.

(Third Embodiment)

Figure 6A:
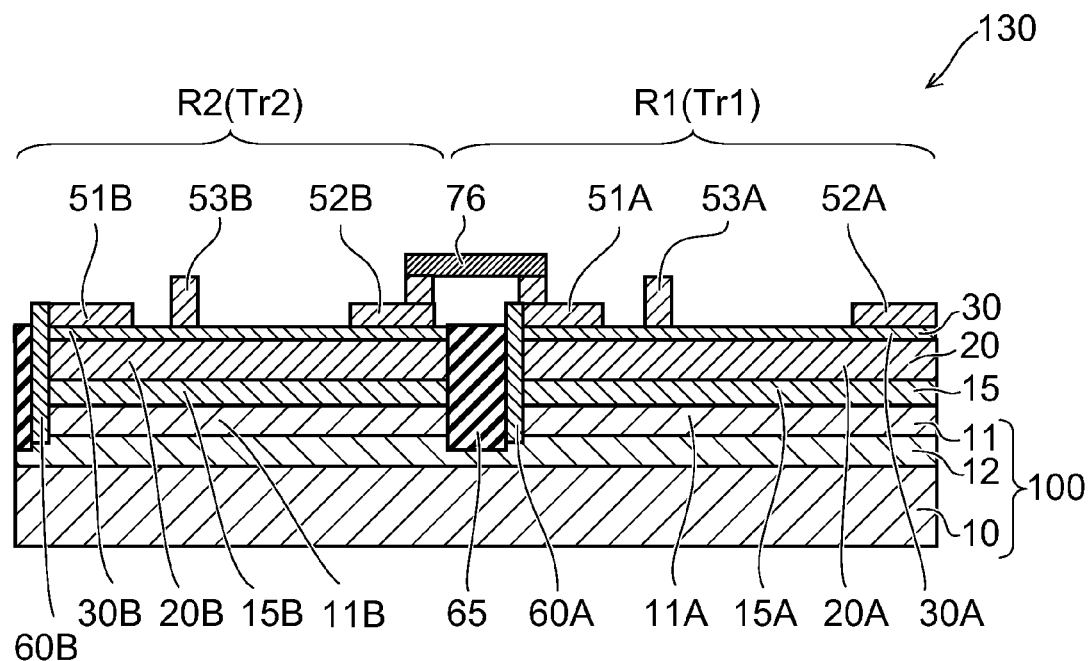
FIG. 6A and FIG. 6B illustrate the configuration of a semiconductor device according to a third embodiment.
Figure 6B:
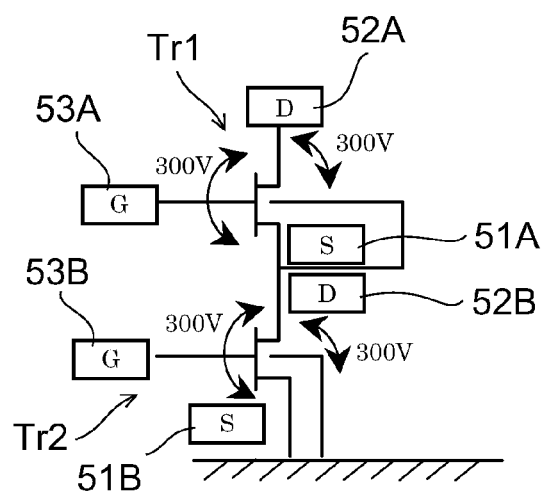

FIGS. 6A and 6B illustrate the configuration of a semiconductor device according to a third embodiment.

FIG. 6A is a schematic sectional view of the semiconductor device 130 according to the third embodiment. FIG. 6B is an equivalent circuit diagram of the semiconductor device 130 according to the third embodiment.

As shown in FIG. 6A, the semiconductor device 130 has a structure in which a plurality of field effect transistors Tr1, Tr2 are formed on an SOI (silicon on insulator) substrate 100.

The SOI substrate 100 includes a support substrate 10 such as a silicon substrate, an insulating layer 12 made of e.g. silicon oxide ($SiO_2$) provided on the support substrate 10, and a conductive region 11 provided on the insulating layer 12. The conductive region 11 is e.g. a semiconductor layer having relatively high impurity concentration (e.g., $n^+$-type silicon layer).

The semiconductor device 130 includes a first semiconductor region 20 including $Al_XGa_{1-X}N$ ($0 \leq X \leq 1$) provided on the conductive region 11, and a second semiconductor region 30 including $Al_YGa_{1-Y}N$ ($0 \leq Y \leq 1$, $X \leq Y$) provided on the first semiconductor region 20.

Furthermore, the semiconductor device 130 includes an isolation region 65 for dividing the conductive region 11, the first semiconductor region 20, and the second semiconductor region 30 into a first region R1 and a second region R2. The isolation region 65 is a trench penetrating through the first semiconductor region 20 and the second semiconductor region 30 and provided halfway through the insulating layer 12. An insulating material may be embedded in the trench of the isolation region 65.

By the isolation region 65, the conductive region 11 is divided into a first conductive region 11A included in the first region R1 and a second conductive region 11B included in the second region R2. By the isolation region 65, the buffer layer 15 is divided into a first buffer layer 15A included in the first region R1 and a second buffer layer 15B included in the second region R2. By the isolation region 65, the first semiconductor region 20 is divided into a first first semiconductor region 20A included in the first region R1 and a second first semiconductor region 20B included in the second region R2. By the isolation region 65, the second semiconductor region 30 is divided into a first second semiconductor region 30A included in the first region R1 and a second second semiconductor region 30B included in the second region R2.

On the second semiconductor region 30 in the first region R1 (first second semiconductor region 30A), a first first electrode 51A, a first second electrode 52A, and a first control electrode 53A are provided and spaced from each other. The first first electrode 51A and the first second electrode 52A are ohmically connected to the second semiconductor region 30. The first first electrode 51A functions as e.g. a source electrode. The first second electrode 52A functions as e.g. a drain electrode. The first control electrode 53A functions as a gate electrode. These constitute a first field effect transistor Tr1 in the first region R1.

On the second semiconductor region 30 in the second region R2 (second second semiconductor region 30B), a second first electrode 51B, a second second electrode 52B, and a second control electrode 53B are provided and spaced from each other. The second first electrode 51B and the second second electrode 52B are ohmically connected to the second semiconductor region 30. The second first electrode 51B functions as e.g. a source electrode. The second second electrode 52B functions as e.g. a drain electrode. The second control electrode 53B functions as a gate electrode. These constitute a second field effect transistor Tr2 in the second region R2.

The semiconductor device 130 includes a connecting section 76 for electrically connecting between the first first electrode 51A and the second second electrode 52B. As shown in FIG. 6B, the connecting section 76 provides a circuit configuration in which the source electrode (first first electrode 51A) of the first field effect transistor Tr1 and the drain electrode (second second electrode 52B) of the second field effect transistor Tr2 are connected.

Furthermore, the semiconductor device 130 includes a first conducting section 60A for electrically connecting between the first first electrode 51A and the first conductive region 11A, and a second conducting section 60B for electrically connecting between the second first electrode 51B and the second conductive region 11B.

In such a semiconductor device 130 according to this embodiment, the first conducting section 60A electrically connects between the first first electrode 51A and the first conductive region 11A. This fixes the first conductive region 11A to the potential of the first first electrode 51A (source electrode). Thus, in the first field effect transistor Tr1, the first conductive region 11A develops a current collapse suppression effect. This suppresses the characteristics variation of the GaN-based first field effect transistor Tr1.

Furthermore, in the semiconductor device 130, the second conducting section 60B electrically connects between the second second electrode 52B and the second conductive region 11B. This fixes the second conductive region 11B to the potential of the second second electrode 52B (drain electrode). Thus, in the second field effect transistor Tr2, the second conductive region 11B develops a current collapse suppression effect. This suppresses the characteristics variation of the GaN-based second field effect transistor Tr2.

Thus, in the semiconductor device 130 according to this embodiment, even if a plurality of field effect transistors (Tr1, Tr2) are formed on one SOI substrate 100, the individual field effect transistors (Tr1, Tr2) are connected to different conductive regions (11A, 11B). This suppresses current collapse in each field effect transistor (Tr1, Tr2). Thus, the semiconductor device 130 as a whole achieves improvement in breakdown voltage, reduction in leakage current, and stabilization in characteristics.

Here, a semiconductor device according to a reference example is described.

Figure 7A:
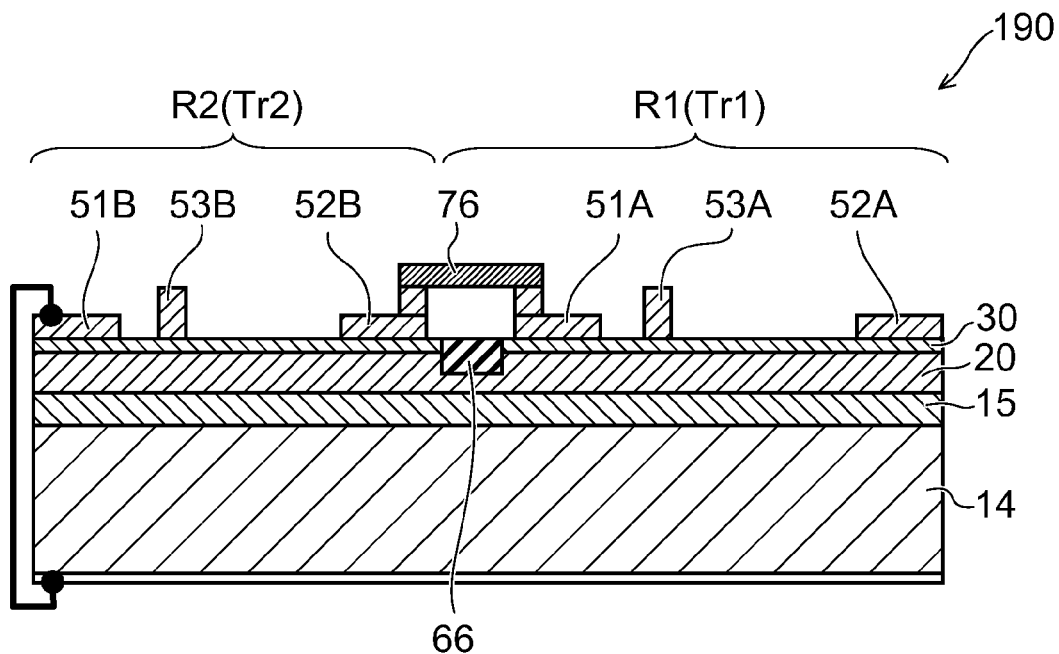
FIG. 7A and FIG. 7B illustrate the configuration of the semiconductor device according to the reference example.
Figure 7B:
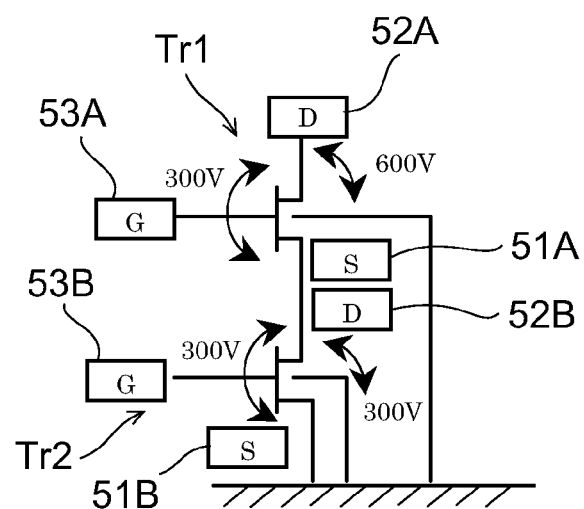

FIGS. 7A and 7B illustrate the configuration of the semiconductor device according to the reference example.

FIG. 7A is a schematic sectional view illustrating the configuration of the semiconductor device 190 according to the reference example. FIG. 7B is a circuit diagram illustrating the circuit configuration of the semiconductor device 190 according to the reference example.

As shown in FIG. 7A, the semiconductor device 190 includes a support substrate 14 made of e.g. an $n^-$-type silicon substrate, a buffer layer 15 formed on the support substrate 14, a first semiconductor region 20 made of e.g. GaN formed on the buffer layer 15, and a second semiconductor region 30 made of e.g. AlGaN formed on the first semiconductor region 20.

A device isolation region 66 is provided in the first semiconductor region 20 and the second semiconductor region 30. By the device isolation region 66, the first semiconductor region 20 and the second semiconductor region 30 are divided into a first region R1 and a second region R2. On the second semiconductor region 30 of the first region R1, a first first electrode 51A, a first second electrode 52A, and a first control electrode 53A are provided and constitute a first field effect transistor Tr1. On the second semiconductor region 30 of the second region R2, a second first electrode 51B, a second second electrode 52B, and a second control electrode 53B are provided and constitute a second field effect transistor Tr2.

In the semiconductor device 190, the first first electrode 51A and the second second electrode 52B are electrically connected by a connecting section 76. The second first electrode 51B is electrically connected to the support substrate 14. In the case where the support substrate 14 is grounded, the second first electrode 51B is also grounded.

As shown in FIG. 7B, the semiconductor device 190 has a circuit configuration in which the source electrode (first first electrode 51A) of the first field effect transistor Tr1 and the drain electrode (second second electrode 52B) of the second field effect transistor Tr2 are connected.

In this circuit configuration, by way of example, the drain electrode (first second electrode 52A) of the first field effect transistor Tr1 is applied with a high voltage (e.g., 600 V). The source electrode (first first electrode 51A) of the first field effect transistor Tr1 and the drain electrode (second second electrode 52B) of the second field effect transistor Tr2 are applied with a low voltage (e.g., 300 V). The source electrode (second first electrode 51B) of the second field effect transistor Tr2 is grounded (0 V).

In this case, in the second field effect transistor Tr2, the potential difference between the source electrode (second first electrode 51B) and the support substrate is equal to 0 V. Thus, electric field relaxation by the support substrate works effectively. However, in the first field effect transistor Tr1, the potential difference between the source electrode (first first electrode 51A) and the support substrate is equal to 300 V, and the potential difference between the drain electrode (first second electrode 52A) and the support substrate is equal to 600 V. Thus, electric field relaxation by the support substrate does not work effectively.

As shown in FIG. 6B, if the semiconductor device 130 according to this embodiment is applied with voltage similar to that for the semiconductor device 190, then in the second field effect transistor Tr2, the potential difference between the source electrode (second first electrode 51B) and the second conductive region 11B is equal to 0 V. Thus, electric field relaxation by the second conductive region 11B works effectively.

Furthermore, in the semiconductor device 130, the first conductive region 11A is isolated from the second conductive region 11B, and is equipotential (300 V) with the source electrode (first first electrode 51A) of the first field effect transistor Tr1. Thus, in the first field effect transistor Tr1, the potential difference between the source electrode (first first electrode 51A) and the first conductive region 11A is equal to 0 V, and the potential difference between the drain electrode (first second electrode 52A) and the support substrate is equal to 300 V. Thus, electric field relaxation by the first conductive region 11A works effectively.

Thus, in the semiconductor device 130 according to this embodiment, current collapse is suppressed in both the first field effect transistor Tr1 and the second field effect transistor Tr2 as compared with the semiconductor device 190 according to the reference example. Accordingly, enhancement in breakdown voltage and reduction in leakage current are improved by electric field relaxation.

(Fourth Embodiment)

Figure 8:
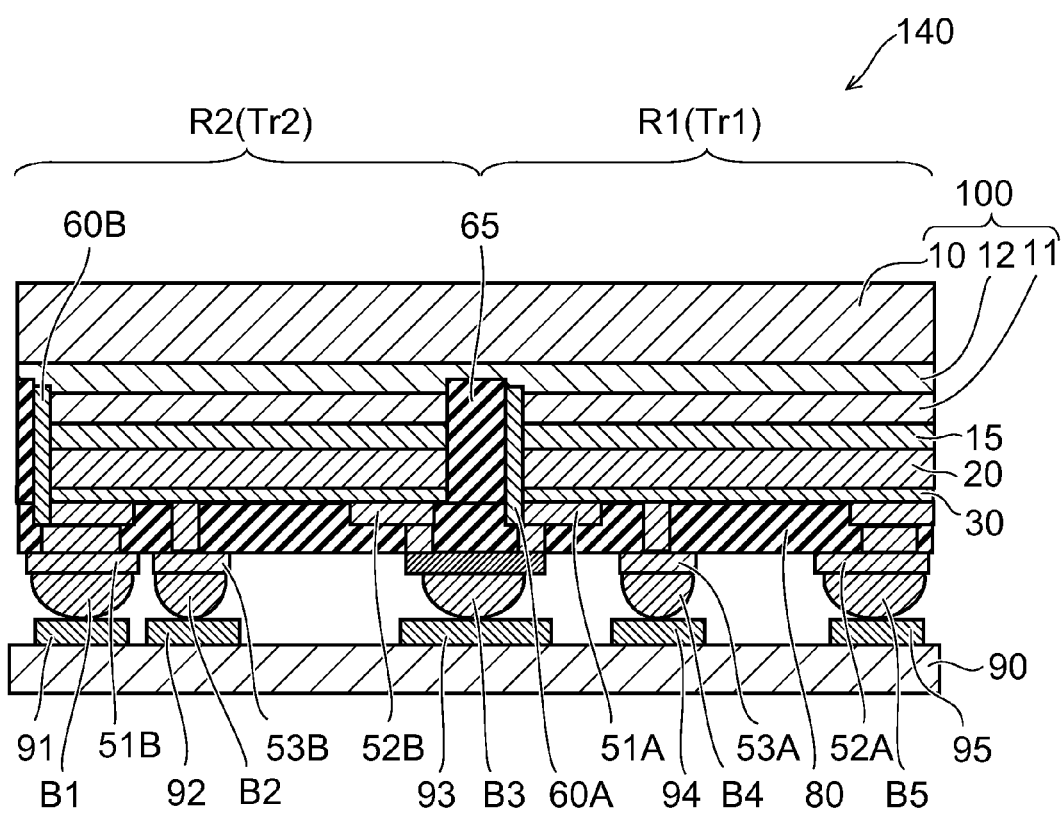
FIG. 8 is a schematic sectional view illustrating the configuration of a semiconductor device according to a fourth embodiment.

FIG. 8 is a schematic sectional view illustrating the configuration of a semiconductor device according to a fourth embodiment.

As shown in FIG. 8, in addition to the configuration of the semiconductor device 130 according to the third embodiment, the semiconductor device 140 according to the fourth embodiment includes bump electrodes B1, B2, B3, B4, and B5 provided on the wiring sections 71, 72, 73, 74, and 75, respectively. In FIG. 8, the configuration of the semiconductor device 130 shown in FIG. 6A is shown upside down.

The bump electrodes B1, B2, B3, B4, and B5 are connected to wiring patterns 91, 92, 93, 94, and 95 provided on a substrate 90. That is, the wiring sections 71, 72, 73, 74, and 75 are connected to the wiring patterns 91, 92, 93, 94, and 95 via the bump electrodes B1, B2, B3, B4, and B5. In addition to the bump electrodes B1, B2, B3, B4, and B5, the semiconductor device 140 may include the substrate 90 on which the wiring patterns 91, 92, 93, 94, and 95 are formed. Thus, the semiconductor device 140 realizes a flip-chip mounting structure in which the semiconductor device 130 according to the third embodiment is mounted on the substrate 90 via the bump electrodes B1, B2, B3, B4, and B5.

In the semiconductor device 140 in which a plurality of field effect transistors (Tr1, Tr2) are integrated, such a flip-chip mounting structure achieves a significant effect of eliminating the need of wiring by bonding wires. Furthermore, even if a plurality of field effect transistors (Tr1, Tr2) are formed on the SOI substrate 100, the current collapse suppression effect is improved for each field effect transistors (Tr1, Tr2). This realizes a semiconductor device 140 of the flip-chip mounting structure having small characteristics variation and being stabilized.

(Fifth Embodiment)

FIGS. 9A to 10B are schematic sectional views illustrating a method for manufacturing a semiconductor device according to a fifth embodiment.

The fifth embodiment illustrates an example of the method for manufacturing the semiconductor device 110 according to the first embodiment and the semiconductor device 120.

Figure 9A:
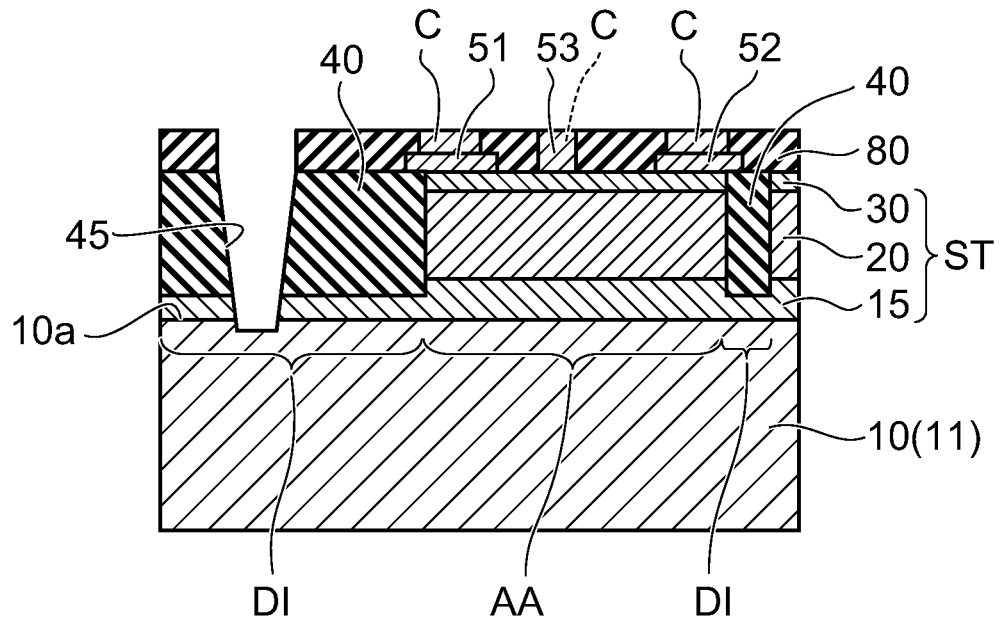
FIG. 9A to FIG. 10B are schematic sectional views illustrating a method for manufacturing a semiconductor device according to a fifth embodiment.

First, as shown in FIG. 9A, on a support substrate 10 including a conductive region 11, a buffer layer 15, a first semiconductor region 20, and a second semiconductor region 30 are formed by e.g. epitaxial growth. The buffer layer 15, the first semiconductor region 20, and the second semiconductor region 30 are e.g. continuously formed on the support substrate 10.

Next, a device isolation region DI is provided in the first semiconductor region 20 and the second semiconductor region 30. That is, the first semiconductor region 20 and the second semiconductor region 30 around the device region AA are etched, and an insulating section 40 is embedded.

Next, on the second semiconductor region 30, a first electrode 51, a second electrode 52, and a control electrode 53 are formed. Then, the first electrode 51, the second electrode 52, and the control electrode 53 are embedded with an interlayer insulating film 80, and the surface of the interlayer insulating film 80 is planarized. Next, contacts C respectively in electrical continuity with the first electrode 51, the second electrode 52, and the control electrode 53 are formed. The contacts C penetrate through the interlayer insulating film 80 and are in contact with the first electrode 51, the second electrode 52, and the control electrode 53, respectively.

Next, in the insulating section 40 of the device isolation region DI, a through-hole 45 extending from the surface of the interlayer insulating film 80 to the support substrate 10 is formed. The through-hole 45 is formed by e.g. wet etching or dry etching.

Figure 9B:
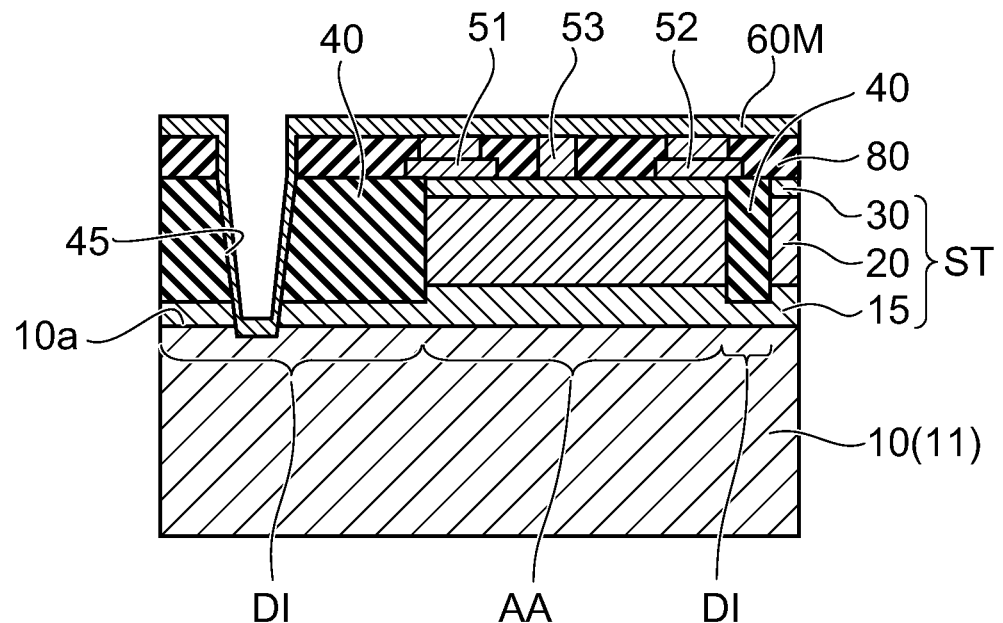
Figure 10A:
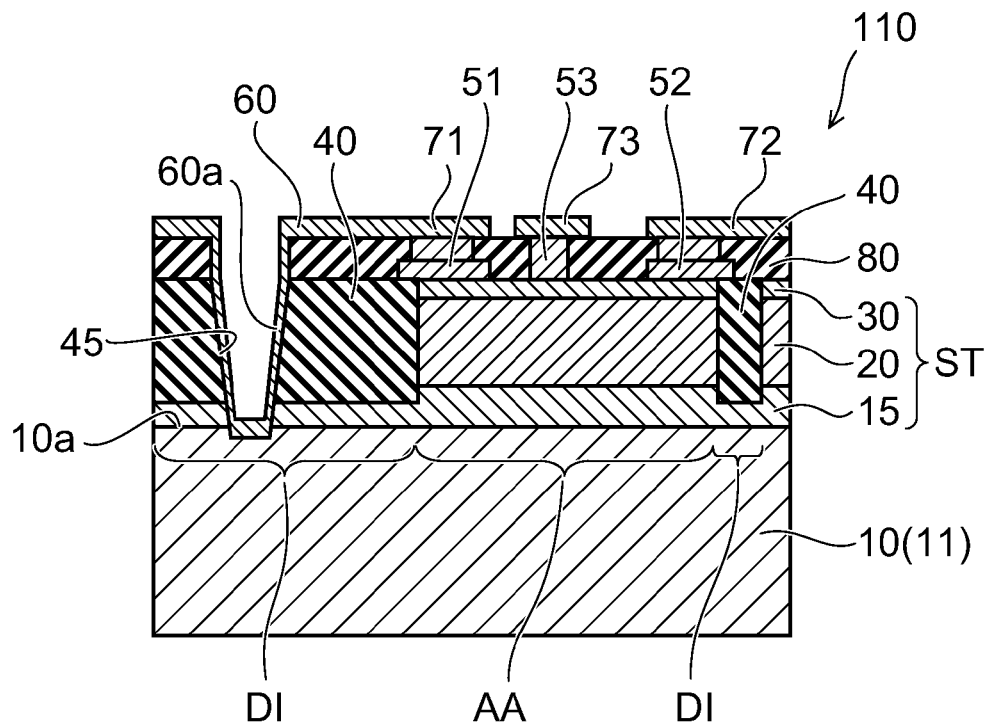

Next, as shown in FIG. 9B, a conducting material 60M is formed on the inner wall of the through-hole 45 and the surface of the interlayer insulating film 80. The conducting material 60M is made of e.g. aluminum (Al). Next, as shown in FIG. 10A, etching is performed so as to leave a prescribed region of the conducting material 60M. By this etching, the conducting material 60M is patterned into wiring sections 71, 72, and 73. The conducting material 60M provided on the inner wall of the through-hole 45 and being in electrical continuity with the wiring section 71 constitutes a conducting section 60. Thus, the semiconductor device 110 is completed.

Figure 10B:
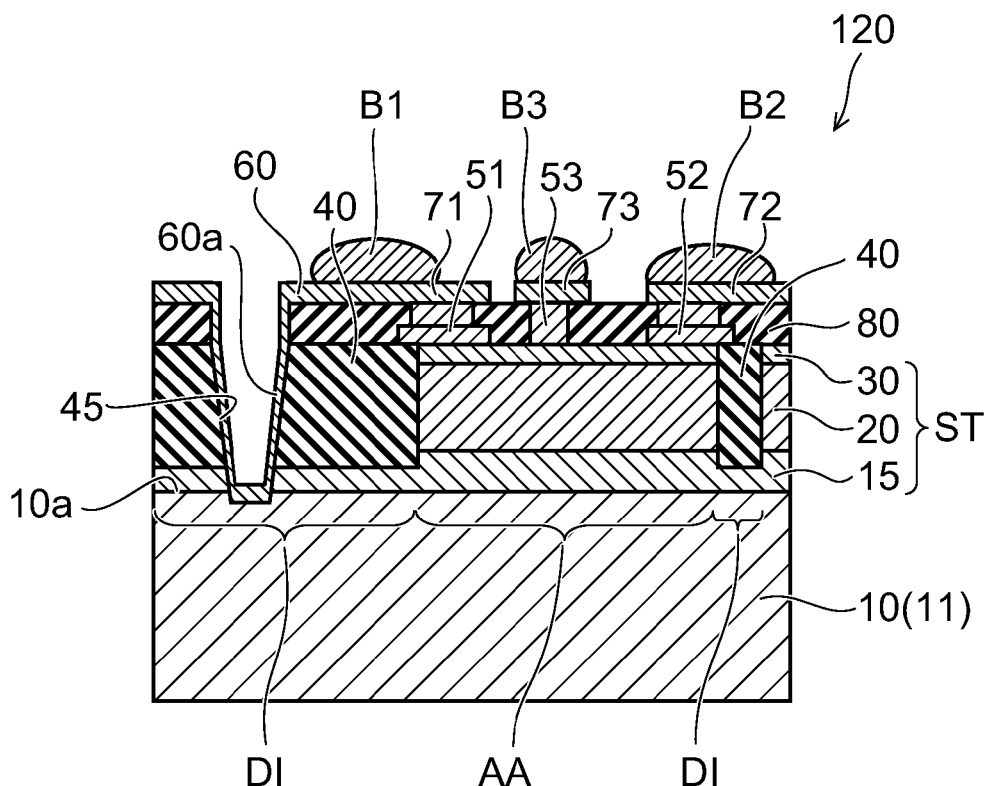

Here, as shown in FIG. 10B, bump electrodes B1, B2, and B3 may be formed as necessary on the wiring sections 71, 72, and 73. Thus, the semiconductor device 120 according to the second embodiment is manufactured.

In the manufacturing method shown in FIGS. 9A to 10B, the through-hole 45 is formed in the insulating section 40 of the device isolation region DI to form a conducting section 60. However, a through-hole 46 penetrating through the first semiconductor region 20 and the second semiconductor region to the conductive region 11 of the support substrate 10 may be formed, and a conducting section 60 may be formed in the through-hole 46. Thus, the semiconductor device 121 is manufactured.

(Sixth Embodiment)

FIGS. 11A to 13C are schematic sectional views illustrating a method for manufacturing a semiconductor device according to a sixth embodiment.

The sixth embodiment illustrates an example of the method for manufacturing the semiconductor device 122 according to the second embodiment. FIGS. 11A to 13C show each electrode portion of two adjacent field effect transistors Tr (the first electrode 51 of one field effect transistor Tr and the second electrode 52 of the other field effect transistor Tr) formed in the device region AA.

Figure 11A:
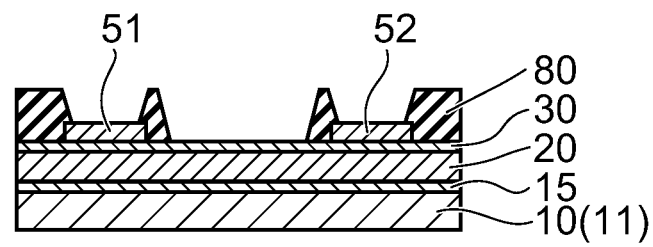
FIG. 11A to FIG. 13C are schematic sectional views illustrating a method for manufacturing a semiconductor device according to a sixth embodiment.

First, as shown in FIG. 11A, a field effect transistor Tr is formed in the device region AA. On the first electrode 51 and the second electrode 52, an interlayer insulating film 80 is provided, and an opening is provided in part of the interlayer insulating film 80. The interlayer insulating film 80 is made of e.g. polyimide.

Figure 11B:
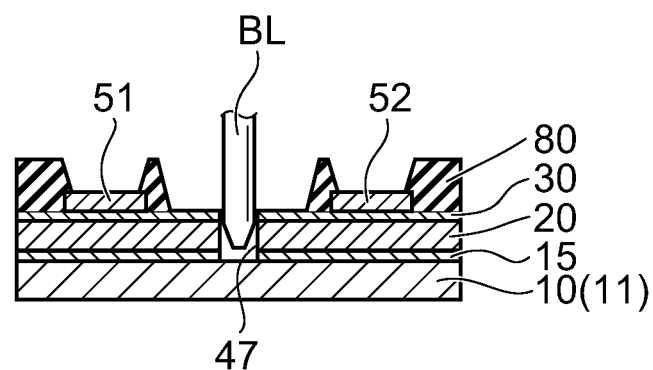

Next, as shown in FIG. 11B, a groove 47 is formed in the device isolation region DI. The groove 47 is formed halfway through the support substrate 10 by e.g. half-cut dicing with a dicing blade.

Figure 11C:
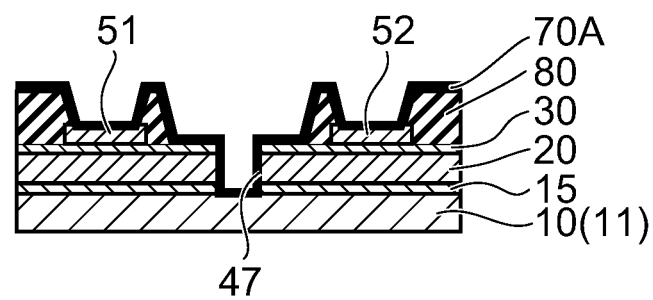

Next, as shown in FIG. 11C, a first metal layer 70A is formed on the surface of the interlayer insulating film 80, the first electrode 51, the second electrode 52, and the groove 47. The first metal layer 70A is made of e.g. a stacked film in which gold (Au) is formed on titanium (Ti).

Figure 12A:
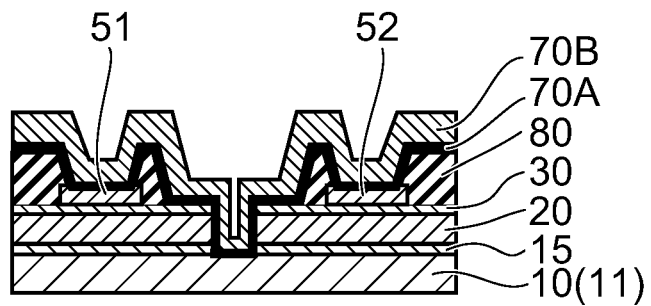

Next, as shown in FIG. 12A, a second metal layer 70B is formed on the first metal layer 70A. The second metal layer 70B is made of e.g. Au. Au of the second metal layer 70B is formed to a thickness of approximately 2 micrometers (μm) on the first metal layer 70A by e.g. electrolytic plating.

Figure 12B:
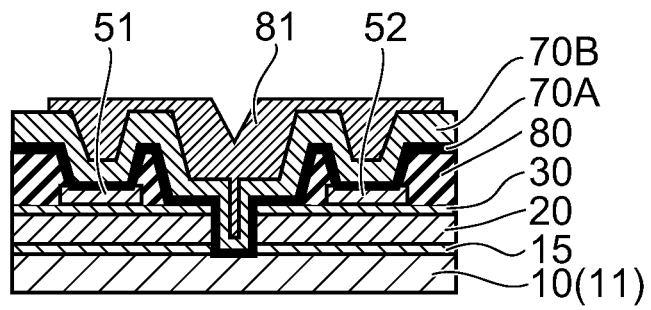
Figure 12C:
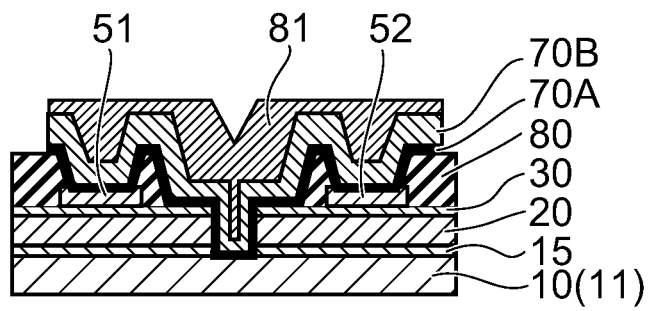

Next, as shown in FIG. 12B, a resist film 81 is formed on the second metal layer 70B. In part of the resist film 81, an opening is provided by photolithography. Then, as shown in FIG. 12C, the resist film 81 is used as a mask to etch part of the first metal layer 70A and the second metal layer 70B. After this etching, the resist film 81 is stripped.

Figure 13A:
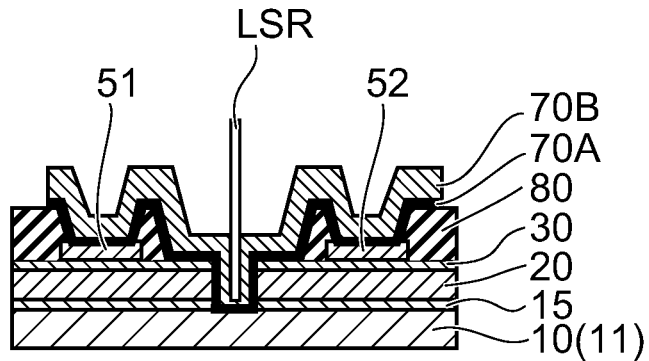

Next, as shown in FIG. 13A, the first metal layer 70A and the second metal layer 70B at the bottom of the groove 47 are removed by irradiation with laser LSR. Thus, the first metal layer 70A and the second metal layer 70B are divided into wiring sections 71 and 72.

Figure 13B:
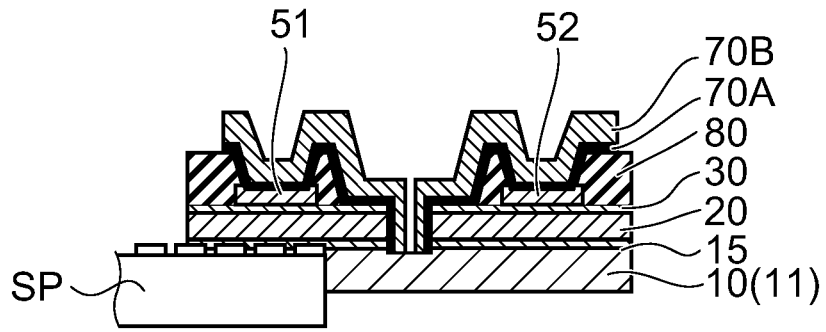
Figure 13C:
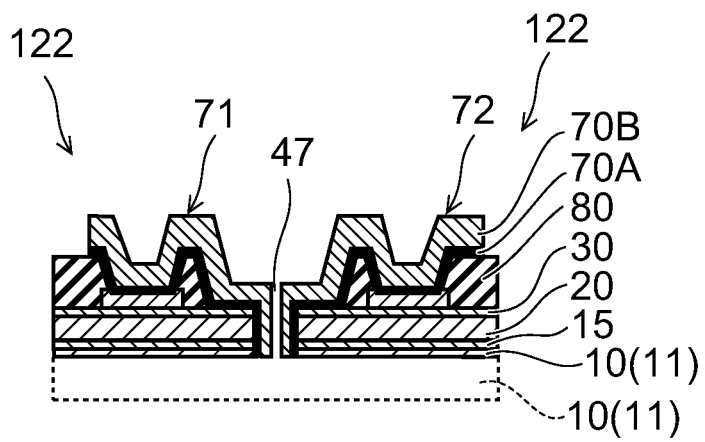

Then, as shown in FIG. 13B, the support substrate 10 is subjected to back surface polishing. The support substrate 10 is polished from the back surface to the position of the groove 47 by a surface plate SP. FIG. 13C shows the state after the back surface polishing of the support substrate 10. Then, the support substrate 10 is divided into chips CP of a prescribed size. This completes the semiconductor device 122 in which the first metal layer 70A and the second metal layer 70B provided in the groove 47 constitute a conducting section 60.

(Seventh Embodiment)

FIGS. 14A to 15B are schematic sectional views illustrating a method for manufacturing a semiconductor device according to a seventh embodiment.

The seventh embodiment illustrates an example of the method for manufacturing the semiconductor device 130 according to the third embodiment and the semiconductor device 140. FIGS. 14A to 15B show one (Tr1) of a plurality of field effect transistors Tr1, Tr2.

Figure 14A:
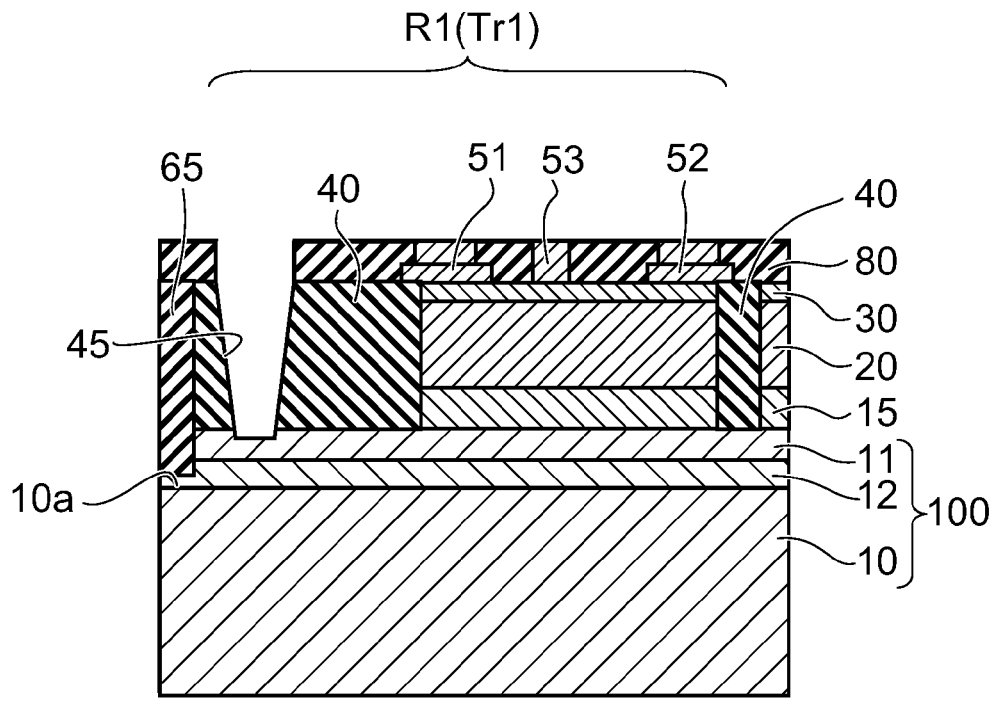
FIG. 14A to FIG. 15B are schematic sectional views illustrating a method for manufacturing a semiconductor device according to a seventh embodiment.

First, as shown in FIG. 14A, a field effect transistor Tr1 is formed in the device region AA. Furthermore, a device isolation region DI is provided in the first semiconductor region 20 and the second semiconductor region 30. In this embodiment, except for use of an SOI substrate, the method for forming the field effect transistor Tr1 and the device isolation region DI is similar to that of the fifth embodiment shown in FIG. 9A.

Next, an isolation region 65 is formed in the device isolation region DI. That is, a trench is provided so as to penetrate through the conductive region 11, the first semiconductor region 20, and the second semiconductor region 30 and to extend halfway through the insulating layer 12. The trench is formed by e.g. wet etching or dry etching. An insulating material may be embedded in the trench to constitute an isolation region 65.

Next, in the insulating section 40 of the device isolation region DI, a through-hole 45 extending from the surface of the interlayer insulating film 80 to the support substrate 10 is formed. The through-hole 45 is provided between the isolation region 65 and the field effect transistor Tr1. The through-hole 45 is formed by e.g. wet etching or dry etching.

Figure 14B:
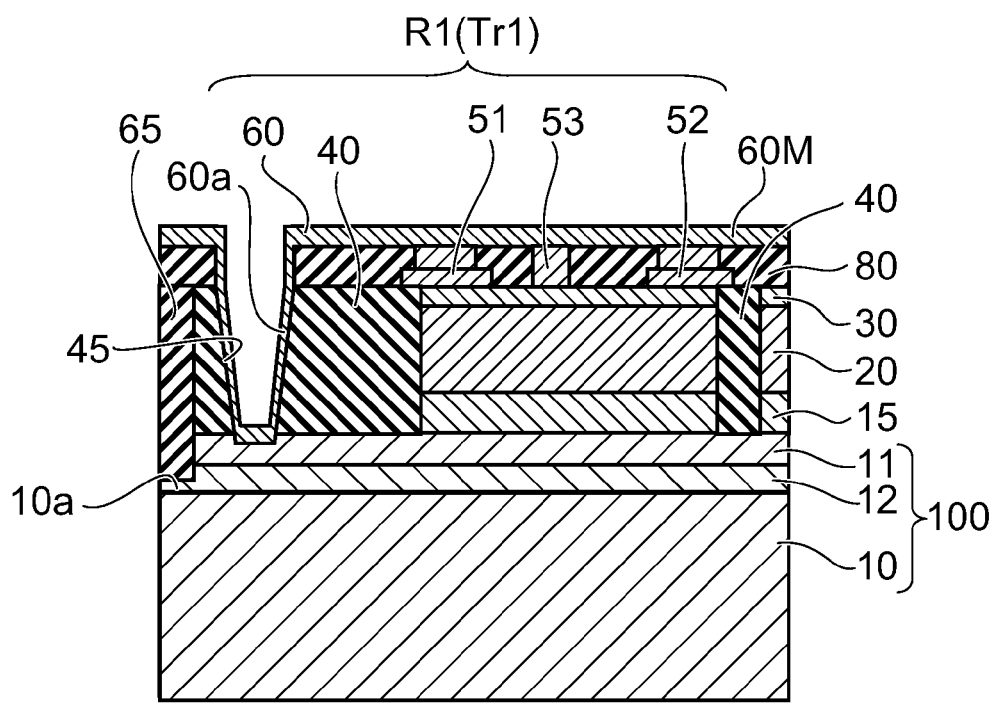
Figure 15A:
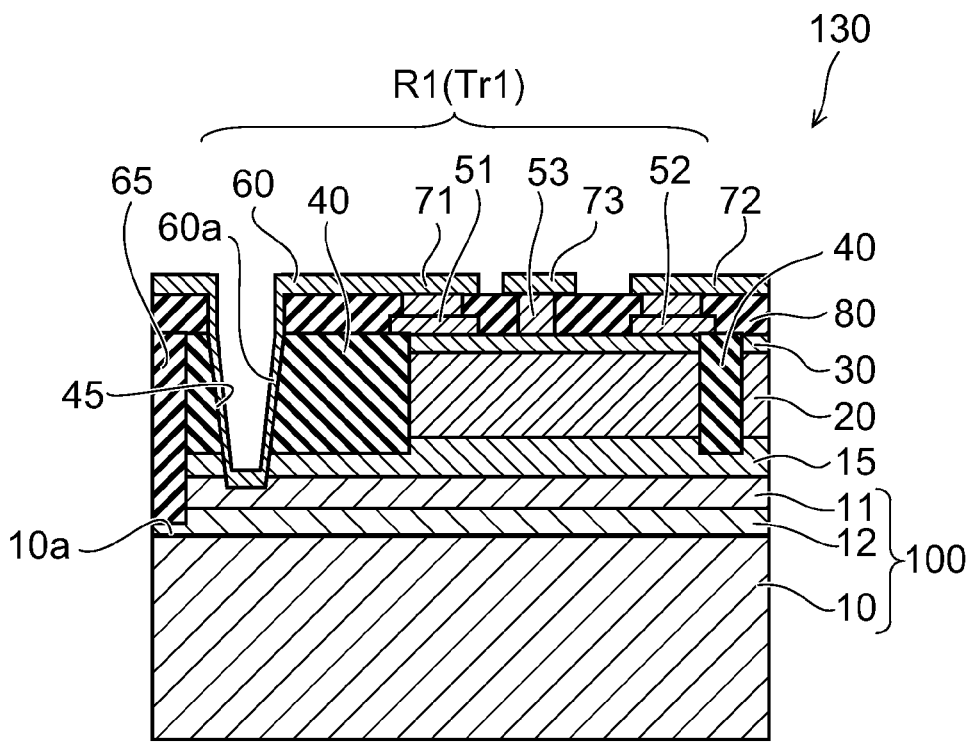

Next, as shown in FIG. 14B, a conducting material 60M is formed on the inner wall of the through-hole 45 and the surface of the interlayer insulating film 80. The conducting material 60M is made of e.g. Al. Next, as shown in FIG. 15A, etching is performed so as to leave a prescribed region of the conducting material 60M. By this etching, the conducting material 60M is patterned into wiring sections 71, 72, and 73.

The conducting material 60M provided on the inner wall of the through-hole 45 and being in electrical continuity with the wiring section 71 constitutes a conducting section 60. Furthermore, the conducting material 60M connected to the conducting section 60 and extending astride the isolation region 65 constitutes a connecting section 76. Thus, the semiconductor device 130 is completed.

Figure 15B:
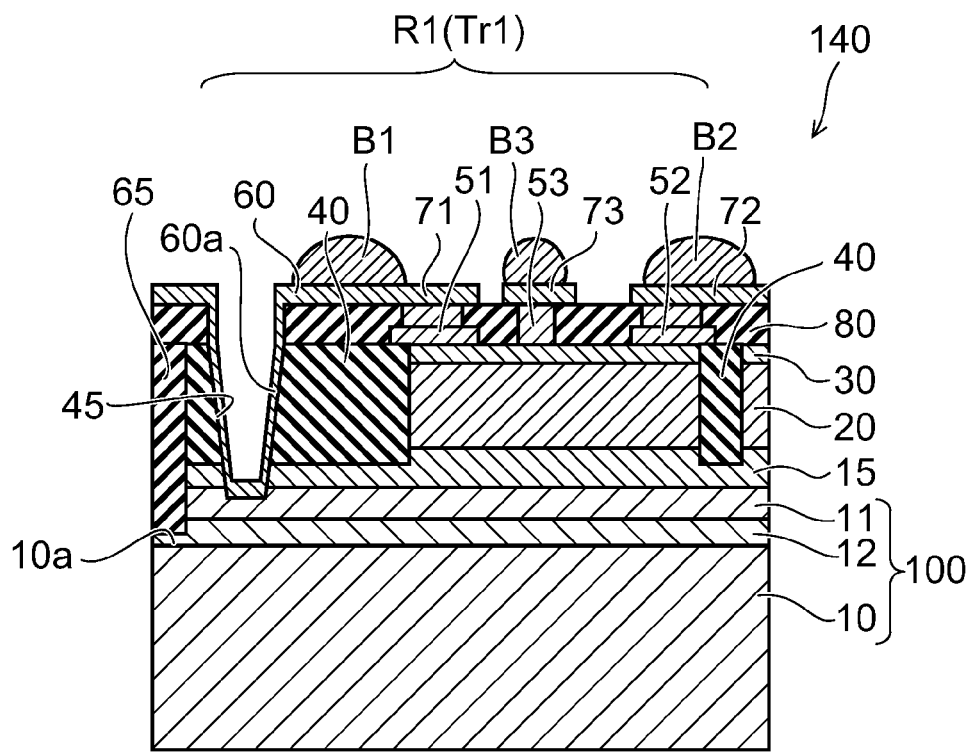

Here, as shown in FIG. 15B, bump electrodes B1, B2, and B3 may be formed as necessary on the wiring sections 71, 72, and 73. Thus, the semiconductor device 140 according to the fourth embodiment is manufactured.

As described above, in the semiconductor device according to the embodiments, the characteristics can be stabilized.

The embodiments and the variations thereof have been described above. However, the invention is not limited to these examples. For instance, while the embodiments have been described with reference to a field effect transistor taken as an example, the embodiments are also applicable to diodes such as Schottky barrier diode. In the case of diodes, the first electrode 51 is caused to function as a cathode electrode, and the control electrode 53 is caused to function as an anode electrode. In the case of diodes, the second electrode 52 is unnecessary. In the case of applying the embodiments to diodes, the conductive region 11 is equipotential with the cathode electrode, and hence effectively serves for current collapse suppression.

In the examples of the embodiments, a plurality of field effect transistors (Tr1, Tr2) are integrated. However, the embodiments are also applicable to the case of integrating a plurality of diodes, and the case of integrating at least one of a field effect transistor and a diode with at least one of a resistor, capacitor, and inductor.

In this specification, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

Furthermore, those skilled in the art can modify the above embodiments or the variations thereof by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a substrate including a conductive region and having a first surface;
   a first semiconductor region provided on the first surface side of the substrate and including $Al_XGa_{1-X}N$ ($0 \leq X \leq 1$);
   a second semiconductor region provided on a side opposite to the substrate of the first semiconductor region and including $Al_YGa_{1-Y}N$ ($0 \leq Y \leq 1$, $X \leq Y$);
   a first electrode provided on a side opposite to the first semiconductor region of the second semiconductor region and ohmically connected to the second semiconductor region;
   a control electrode provided on a side opposite to the first semiconductor region of the second semiconductor region and spaced from the first electrode;
   a second electrode provided on a side opposite to the first semiconductor region of the second semiconductor region, spaced from the first electrode and the control electrode, and ohmically connected to the second semiconductor region;
   a conducting section electrically connecting between the first electrode and the conductive region, and
   a wiring section being in electrical continuity with each of the first electrode, the second electrode, and the control electrode; and
   a bump electrode being in electrical continuity with the wiring section.

2. The device according to claim 1, wherein the conducting section has a portion extending from the second semiconductor region toward the first semiconductor region.

3. The device according to claim 1, further comprising:
   a device isolation section provided on the first surface side of the substrate and around the first semiconductor region and the second semiconductor region; and
   an insulating section provided on the device isolation section.

4. The device according to claim 3, wherein the conducting section has a portion provided along a side surface of the insulating section.

5. The device according to claim 1, wherein the conducting section is provided along respective side surfaces of the conductive region, the first semiconductor region, and the second semiconductor region.

6. The device according to claim 1, further comprising:
   a substrate on which a plurality of wiring patterns are formed,
   wherein each of the first electrode, the second electrode, and the control electrode is connected to one of the plurality of wiring patterns via the bump electrode.

7. The device according to claim 1, further comprising:
   a buffer layer provided between the first semiconductor region and the substrate.

8. The device according to claim 1, wherein the substrate includes a silicon layer and an insulating layer provided between the silicon layer and the conductive region.

9. A semiconductor device comprising:
   a support substrate having a first surface;
   an insulating layer provided on the first surface side of the support substrate;
   a conductive region provided on a side opposite to the support substrate of the insulating layer;
   a first semiconductor region provided on a side opposite to the insulating layer of the conductive region and including $Al_XGa_{1-X}N$ ($0 \leq X \leq 1$);
   a second semiconductor region provided on a side opposite to the conductive region of the first semiconductor region and including $Al_YGa_{1-Y}N$ ($0 \leq Y \leq 1$, $X \leq Y$);
   an isolation region dividing the conductive region, the first semiconductor region, and the second semiconductor region into a first region and a second region;
   a first first electrode, a first second electrode, and a first control electrode provided on a side opposite to the first semiconductor region of the second semiconductor region in the first region and spaced from each other;
   a second first electrode, a second second electrode, and a second control electrode provided on a side opposite to the first semiconductor region of the second semiconductor region in the second region and spaced from each other;
   a connecting section electrically connecting between the first first electrode and the second second electrode;
   a first conducting section electrically connecting between the first first electrode and the conductive region of the first region; and
   a second conducting section electrically connecting between the second first electrode and the conductive region of the second region.

10. The device according to claim 9, further comprising:
    a wiring section being in electrical continuity with each of the first first electrode, the first control electrode, the second control electrode, the second second electrode, and the connecting section; and
    a bump electrode being in electrical continuity with the wiring section.

11. The device according to claim 10, further comprising:
    a substrate on which a plurality of wiring patterns are formed,
    wherein each of the first first electrode, the first control electrode, the second control electrode, the second second electrode, and the connecting section is connected to one of the plurality of wiring patterns via the bump electrode.

12. The device according to claim 9, further comprising:
a buffer layer provided between the first semiconductor region and the conductive region.

\* \* \* \* \*